(12) United States Patent
Igarashi

(10) Patent No.: US 6,623,985 B1
(45) Date of Patent: Sep. 23, 2003

(54) STRUCTURE OF AND MANUFACTURING METHOD FOR SEMICONDUCTOR DEVICE EMPLOYING FERROELECTRIC SUBSTANCE

(75) Inventor: Yasushi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 26 days.

(21) Appl. No.: 09/628,440

(22) Filed: Jul. 28, 2000

(30) Foreign Application Priority Data

Mar. 13, 2000 (JP) ......................... 2000-068779

(51) Int. Cl.[7] .................... H01L 21/00; H01L 29/76
(52) U.S. Cl. ..................... 438/3; 438/240; 438/444; 438/648; 438/735; 438/757; 257/310; 257/298; 257/303; 257/306; 257/532; 257/637
(58) Field of Search .................... 438/3, 240, 444, 438/627, 690, 704, 724, 734, 757, 785, 117, 125, 232, 253, 643, 648, 678, 656, 592, 625, 660; 257/298–310, 324, 532, 637, 790

(56) References Cited

U.S. PATENT DOCUMENTS

| | | | | |
|---|---|---|---|---|
| 4,981,816 A | * | 1/1991 | Kim et al. | 438/648 |
| 5,103,272 A | * | 4/1992 | Nishiyama | 257/388 |
| 5,879,985 A | | 3/1999 | Gambino et al. | |
| 6,144,060 A | * | 11/2000 | Park et al. | 257/310 |
| 6,191,463 B1 | * | 2/2001 | Mitani et al. | 257/411 |
| 6,246,082 B1 | * | 6/2001 | Mitarai et al. | 257/295 |
| 6,355,952 B1 | | 3/2002 | Yamoto et al. | |
| 6,376,370 B1 | * | 4/2002 | Farrar | 438/678 |
| 6,509,601 B1 | * | 1/2003 | Lee et al. | 257/310 |

FOREIGN PATENT DOCUMENTS

| | | | | |
|---|---|---|---|---|
| JP | 05275652 A | * | 10/1993 | ........... H01L/27/11 |
| JP | 9-97883 | | 4/1997 | |
| JP | 09326490 A | * | 12/1997 | ........... H01L/29/78 |
| JP | 10-275903 | | 10/1998 | |
| JP | 11-26722 | | 1/1999 | |
| JP | 11-87633 | | 3/1999 | |
| JP | 11-168193 | | 6/1999 | |

OTHER PUBLICATIONS

Ochiai et al., Patent Abstracts of Japan, Pub. No. 9–097883, Pub. Date: Apr. 2, 1997.
Gambino et al., Patent Abstracts of Japan, Pub. No. 10–275903, Pub. Date: Mar. 9, 1999.
Nakajima, Patent Abstracts of Japan, Pub. No. 11–087633, Pub. Date: Mar. 30, 1999.
Shinohara, Patent Abstracts of Japan, Pub. No. 11–168193, Pub. Date: Jun. 22, 1999.
Suzuki et al., Patent Abstracts of Japan, Pub. No. 11–026722, Pub. Date: Jan. 29, 1999.
Kushida–Abdeghafar, et al., "Electrode–induced degradation of $Pb(Zr_xTi_{1-x})O_3$ (PZT) Polarization hysteresis characteristics in Pt/PZT/Pt ferroelectric thin–films capacitors", Appl. Phys. Lett. 69 (21), Nov. 18, 1996, pp. 3188–3190.

* cited by examiner

Primary Examiner—Caridad Everhart
Assistant Examiner—Igwe U. Anya
(74) Attorney, Agent, or Firm—Venable LLP; Michael A. Sartori; Ashley J. Wells

(57) ABSTRACT

A semiconductor device and method for manufacturing the same in which the semiconductor device includes a substrate; an MOS transistor formed on the substrate; an interlayer dielectric provided on at least a portion of the MOS transistor; a hydrogen occluding material which is an interstitial hydrogen occluding compound, which is provided on the interlayer dielectric, and which is employed as a wire by being disposed in the vicinity of the top of the MOS transistor; and a ferroelectric capacitor which has a height which is greater than that of the MOS transistor, wherein the hydrogen occluding material is placed between the MOS transistor and the ferroelectric capacitor.

8 Claims, 5 Drawing Sheets

STRUCTURE OF AND MANUFACTURING METHOD FOR SEMICONDUCTOR DEVICE EMPLOYING FERROELECTRIC SUBSTANCE

BACKGROUND OF THE INVENTION

1. Field of the Invention

The present invention relates to a structure of and a manufacturing method for a semiconductor device and, more particularly, to a structure of and a manufacturing method for a device which employs a ferroelectric substance and is ideally used for a memory.

2. Description of Related Art

Name of Literature: Appl. Phys. Lett., Vol. 69, p.p.3188–3190 (1996) by Keiko Kushida-Abdelghafar, Hiroshi Miki, Kazuyoshi Torii, and Yoshihisa Fujisaki.

In a current manufacturing process of a semiconductor device, a step for performing heat treatment in a $H_2$ gas is essential. The step for carrying out the heat treatment in the $H_2$ gas has been extensively implemented as an important step for stabilizing characteristics of a device, typically represented by a MOSFET, thereby improving reliability.

As a ferroelectric substance, $Pb(Zr_xTi_{1-x})O_3$ (hereinafter referred to as "PZT") is being considered to be applied to a memory or a storage cell, more particularly to a ferroelectric memory. A capacitor part of a ferroelectric memory employing PZT generally employs Pt as an electrode. As shown in the above literature, in a Pt/PZT/Pt multilayer structure, a film quality of a PZT layer is changed by the heat treatment in the $H_2$ gas. The change causes degradation of a hysteresis characteristic of the ferroelectric capacitor.

In addition to the PZT mentioned above, many other materials are being zealously studied as candidate ferroelectric or high-dielectric-constant materials applicable to semiconductor devices. Such ferroelectric materials include $SrBi_2Ta_2O_9$ (SBT), $Pb_5Ge_3O_{11}$, $Bi_4Ti_3O_{12}$, and $Ba_xSr_{1-x}TiO_3$. Such high-dielectric-constant materials include $Ta_2O_5$, $ZrO_2$, $HfO_2$, and $CeO_2$.

The above materials are characterized in that they are all oxides. The foregoing PZT and oxides present a problem in that the heat treatment in a reducing atmosphere, such as in the $H_2$ gas, causes oxygen to be eliminated due to a reductive reaction, and compositions of the oxide materials are changed.

For example, in the case of the ferroelectric memory employing PZT, the heat treatment in the $H_2$ gas mentioned above changes the film quality, deteriorating the characteristics, especially the hysteresis characteristic, of the memory. On the other hand, skipping the heat treatment in the $H_2$ gas poses a problem of unstable characteristics of other devices, including transistors.

Thus, there has been a problem in that the conventional manufacturing process cannot be used as it is when applying the aforesaid materials to the ferroelectric memories or the like.

SUMMARY OF THE INVENTION

Accordingly, an object of the present invention is to provide a structure of a semiconductor device that obviates the need for heat treatment in a hydrogen atmosphere after completion of a semiconductor manufacturing process. It is another object of the present invention to provide a manufacturing method for a semiconductor device whereby degradation of a hysteresis characteristic of a ferroelectric memory or the like can be prevented.

To these ends, according to one aspect of the present invention, there is provided a structure of a semiconductor device, including: a MOS transistor on a substrate; and a hydrogen occluding material used for wiring is disposed via an interlayer dielectric in the vicinity of a top of the MOS transistor. The hydrogen occluding material is subjected to heat treatment in an atmosphere containing hydrogen thereby to occlude hydrogen. Thereafter, heat treatment is performed in an atmosphere that contains no hydrogen so as to make the hydrogen occluded by the hydrogen occluding material be released. This causes hydrogen to be supplied to the MOS transistor and other devices formed on the substrate to stabilize the characteristics thereof.

According to another aspect of the present invention, there is provided a manufacturing method for a semiconductor device including the steps of: forming a MOS transistor on a substrate; forming a hydrogen occluding compound, more specifically, a hydrogen occluding silicide, on a source-drain and gate electrodes of the MOS transistor; and subjecting the hydrogen occluding silicide to heat treatment for occluding hydrogen in an atmosphere containing hydrogen. The silicide consists of one metal selected from among Ta, Ti, Zr, Fe, Cr, La, and Th, and Si. Heat treatment is performed in an atmosphere free of hydrogen in a subsequent step to release hydrogen from the silicide that has occluded hydrogen so as to supply hydrogen to the MOS transistor and other devices, thus enabling the characteristics thereof to be stabilize. Thus, the objects described above can be fulfilled.

DESCRIPTION OF THE PREFERRED EMBODIMENTS

An object of the present invention is to provide a structure and a manufacturing method that replace a conventional manufacturing process to apply the foregoing ferroelectric materials or high-dielectric-constant materials to a semiconductor device. The structure and the manufacturing method in accordance with the present invention make it possible to supply hydrogen to an unpaired bonding hand in the vicinity of a gate oxide film of, for example, a MOSFET, which is a representative semiconductor device, thereby to decrease a density of unpaired bonding hands without the need for performing heat treatment in a $H_2$ gas.

The following will describe embodiments of the present invention. For easy understanding, PZT will be used as an example selected from among ferroelectric materials and high-dielectric-constant materials. It is needless to say, therefore, the present invention can be applied to a structure and a manufacturing method that employ the foregoing materials in addition to PZT.

First Embodiment

A first embodiment of the present invention will now be described in detail with reference to FIG. 1 and FIG. 2. This embodiment will show a manufacturing method for forming a ferroelectric capacitor on a top of an NMOS formed in a p-type conductive region via an interlayer dielectric, and a structure completed as a result of implementing the manufacturing method.

Figure 1A:
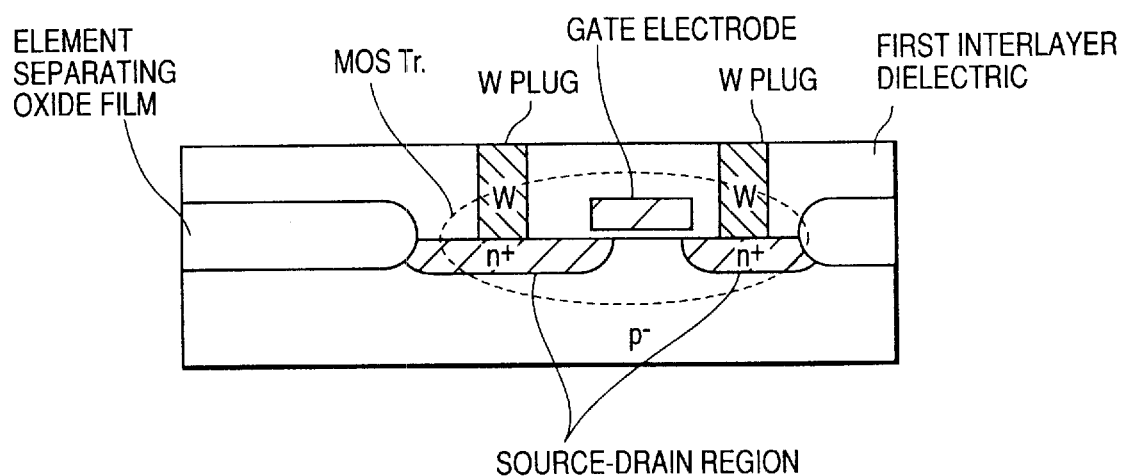
FIG. 1 is a sectional view illustrating step 1 of a first embodiment in accordance with the present invention.

In a first step, according to a publicly known method, a MOS transistor composed of source-drain regions, a gate oxide film (not shown), and a gate electrode is formed. In a second step, a first interlayer dielectric is deposited by a CVD or the like. In a third step, contact holes extending to the source-drain regions are formed in the first interlayer dielectric by the publicly known photolithography and etching. In a fourth step, the contact holes are filled with W or another metal material. Refer to FIG. 1A.

In a fifth step, Ta serving as a wiring material is deposited on the first interlayer dielectric, and patterning is carried out by a publicly known method. For the patterning, the Ta wire is desirably extended in the vicinity of the MOS transistor. In a sixth step, heat treatment is performed within a temperature range from 500° C. to 900° C. in an atmosphere containing hydrogen, e.g., an atmosphere containing one or both of $H_2$ and $NH_3$. One or both of Ar and $N_2$ may be further added to the atmosphere. More preferably, the heat treatment is carried out in the foregoing atmosphere at 600° C. for 30 minutes.

As widely known, Ta is a hydrogen occluding metal; therefore, the heat treatment allows Ta to occlude hydrogen. These materials are referred to as interstitial hydrogen occluding materials (metals or compounds), and are characteristic in that they occlude hydrogen, hydrogen atoms entering lattice gaps of the material.

Figure 1B:
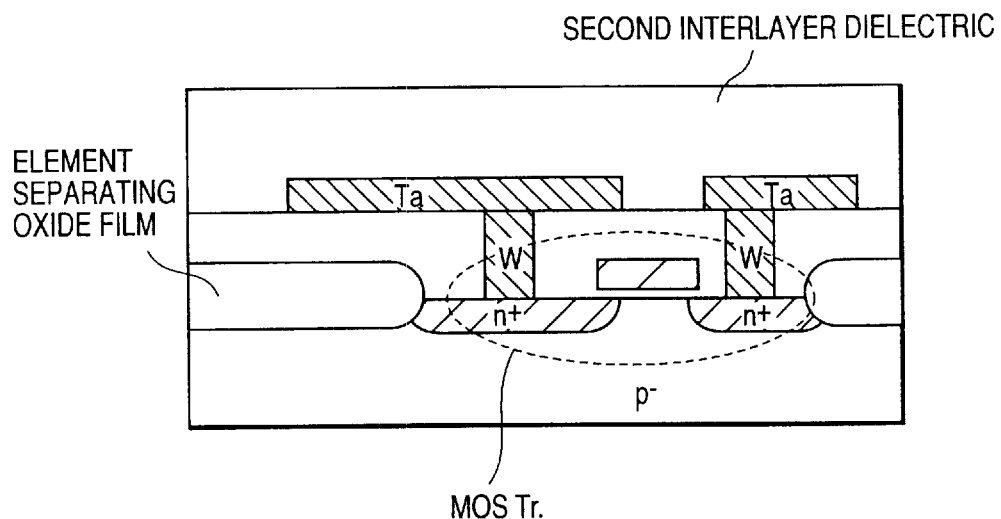

In a seventh step, a second interlayer dielectric is formed by the CVD. In this case, it should be noted that Ta functions as part of the wiring rather than serving as a dummy. This step is illustrated in FIG. 1B.

Figure 2C:
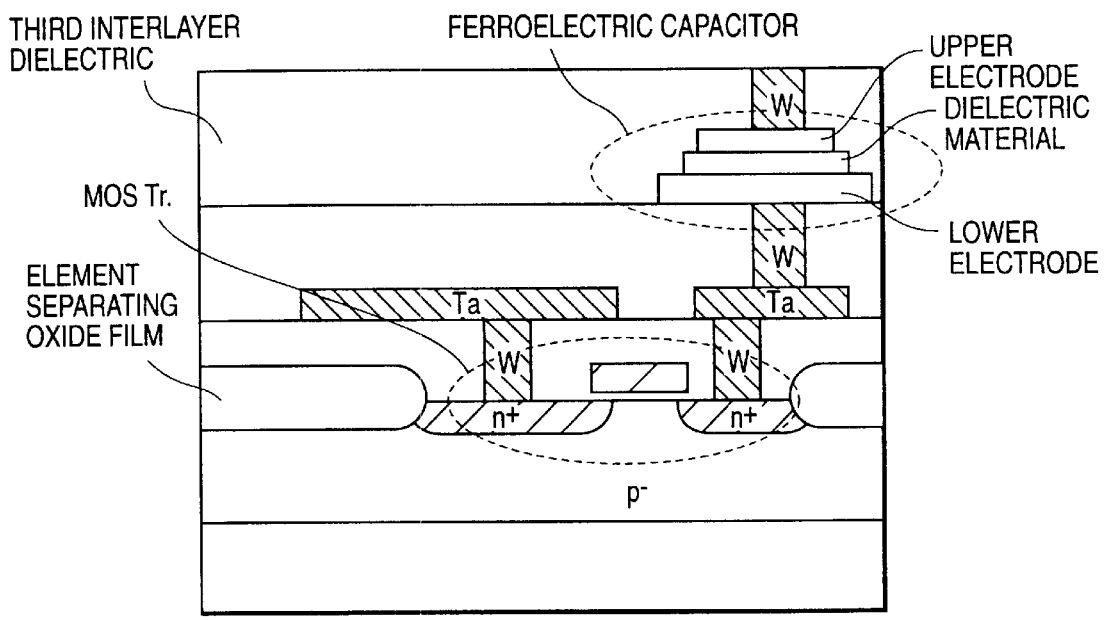
FIG. 2 is a sectional view illustrating step 2 of the first embodiment in accordance with the present invention.

In an eighth step, contact holes for connecting a patterned Ta wiring layer and a lower electrode of a ferroelectric capacitor are formed (not shown). In a ninth step, the contact holes are filled with W or another metal material to form metal plugs. In a tenth step, a ferroelectric capacitor (high-dielectric-constant capacitor) constructed by three layers, namely, a lower electrode, a ferroelectric film or a high-dielectric-constant film, and an upper electrode, is formed using a publicly known method. At this time, the foregoing metal plugs are electrically connected with the lower electrode of the ferroelectric capacitor. Then, a third interlayer dielectric is formed using the CVD. In an eleventh step, contact holes extending to the upper electrode of the ferroelectric capacitor are opened and filled with W or another metal material. Refer to FIG. 2C.

Figure 2D:
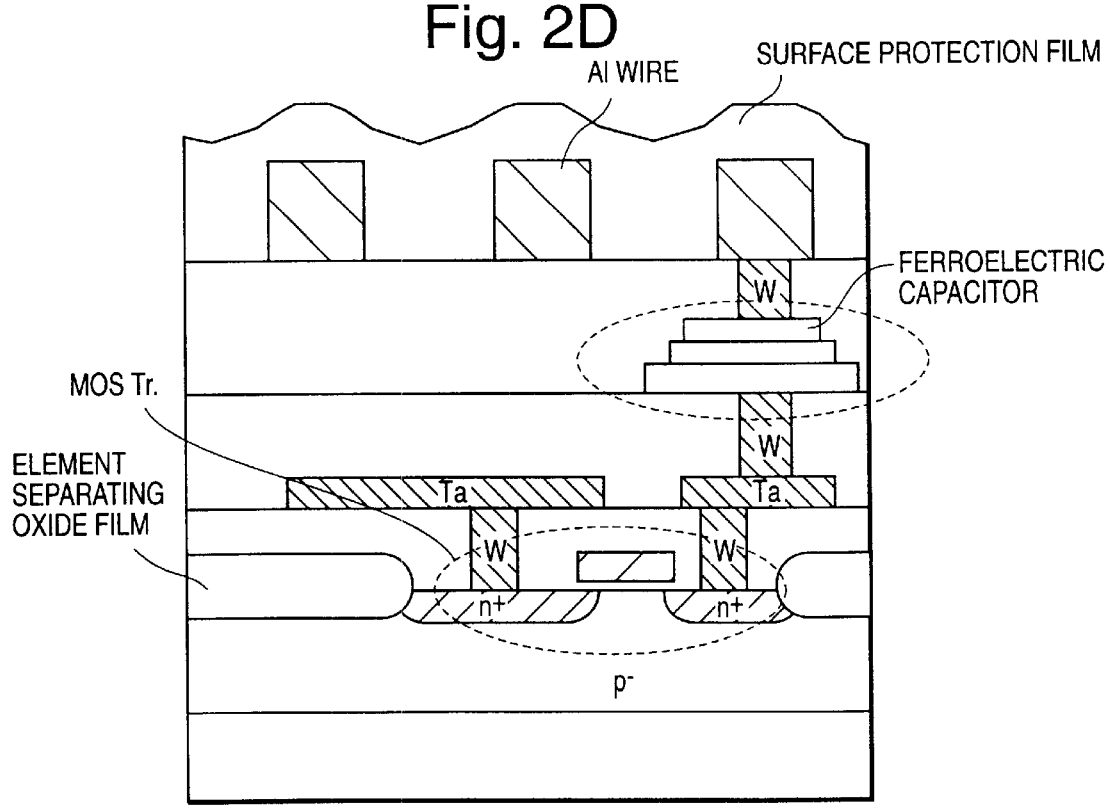

In a twelfth step, a wiring material composed of an Al alloy or the like is deposited by a publicly known sputtering process or the like, then patterning is carried out using a publicly known method. Thereafter, a surface protection film composed of a nitride film or the like is formed using a plasma CVD or the like. Refer to FIG. 2D.

In a standard process, before completing the process set forth above, heat treatment is performed in an atmosphere containing hydrogen at a temperature of 350° C. to 450° C. to supply hydrogen mainly to a vicinity of the gate electrode of the MOS transistor so as to bond hydrogen atoms to unpaired bonding hands of Si generated by the process, thereby stabilizing the characteristics of the semiconductor device.

According to the present invention, however, Ta that has occluded hydrogen is disposed in the vicinity of the MOS transistor. Hence, before forming an Al wiring layer, heat treatment is performed in an inert gas, such as Ar or $N_2$, at 500° C. to 900° C., for example, in place of the heat treatment in an atmosphere containing hydrogen. This allows hydrogen occluded in Ta to be supplied primarily to an area around the gate electrode of the MOS transistor. More preferably, the heat treatment is performed by rapid thermal annealing (RTA) at 600° C. for about 30 seconds. This heat treatment prevents hydrogen from being supplied to a ferroelectric material or a high-dielectric-constant material, such as PZT, so that they are not reduced. Hence, a ferroelectric capacitor or a high-dielectric-constant capacitor maintaining a good hysteresis characteristic can be formed. To simplify the process, the heat treatment can be replaced by an existing heat treatment, such as a heat treatment in a step for producing a ferroelectric film or a high-dielectric-constant film.

According to the conventional process, in a state where the heat treatment in an atmosphere containing hydrogen has not been performed, there are many unpaired bonding hands of Si in the vicinity of the gate oxide film of the NMOS. In this state, it is difficult for a gate voltage to be applied to a semiconductor substrate, causing a threshold value of the NMOS to vary. Furthermore, unpaired bonding hands of channels lead to deteriorated mobility of electrons, resulting in deteriorated characteristics of the NMOS, typically indicated by a drop in an ON/OFF ratio of the NMOS.

The heat treatment in the $H_2$ gas is performed to bond $H^+$ ions to unpaired bonding hands thereby to make electrons inactive. The heat treatment, therefore, is able to prevent the threshold value from varying and also prevent the mobility from deteriorating.

In the structure according to the present invention, the Ta wire that has occluded hydrogen is disposed in the vicinity of the gate electrode of the MOS transistor, and unpaired bonding hands can be inactivated by supplying the $H^+$ ions to the neighborhood of the gate electrode of the MOS transistor by performing the heat treatment in the atmosphere free of hydrogen.

Thus, the need for carrying out the heat treatment in the atmosphere containing hydrogen after the ferroelectric film is formed is obviated, making it possible to realize a ferroelectric capacitor that maintains a good hysteresis characteristic.

As is obvious from the descriptions above, the structure according to the present invention has a Ta wire disposed in the vicinity of a top of a MOS transistor via an interlayer dielectric. This arrangement makes it possible to provide the same effect as that obtained by heat treatment performed in an atmosphere containing hydrogen even when the atmosphere in which heat treatment is performed upon completion of a process does not contain hydrogen.

Figure 3:
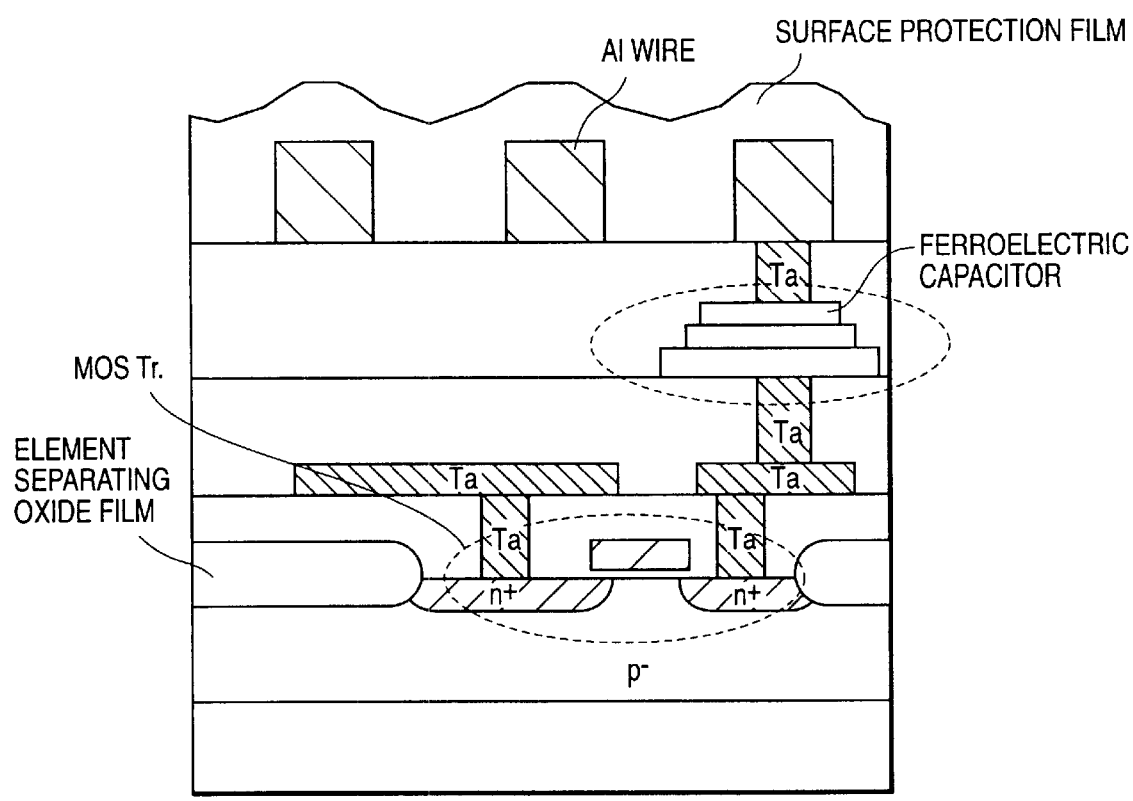
FIG. 3 is a sectional view illustrating a modification example of the first embodiment in accordance with the present invention.

Moreover, as shown in FIG. 3, it is obvious that the same advantage will be obtained even if W used for forming the portion shown in FIG. 2D is replaced by Ta. When replacing W in the vicinity of a ferroelectric material by Ta, it is important not to expose the device to an atmosphere containing hydrogen after forming a Ta film.

It is also obvious that the same advantage can be obtained even if a metal in addition to Ta, e.g., a metal forming another interstitial hydrogen compound is used as a hydrogen occluding metal. Metals forming interstitial hydrogen compounds include Ta, Ti, Zr, Fe, Cr, La, and Th in addition to an alloy that contains one or more of these materials.

Thus, according to the first embodiment, an operation of the MOS transistor can be stabilized without performing the heat treatment in the atmosphere containing hydrogen upon completion of the process. Moreover, neither the characteristics of the MOS transistor nor the characteristics of the ferroelectric capacitor is sacrificed in producing the device.

Second Embodiment

A second embodiment in accordance with the present invention will now be explained in detail with reference to FIG. 4 and FIG. 5. This embodiment will show a structure wherein a ferroelectric capacitor is formed on a top of an NMOS transistor formed in a p-type conductive region via an interlayer dielectric.

Figure 4A:
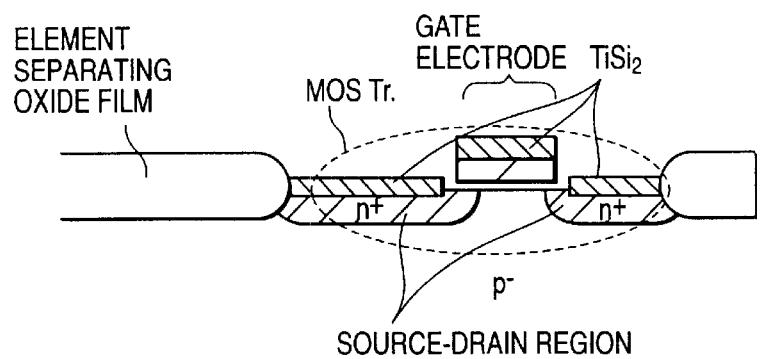
FIG. 4 is a sectional view illustrating step 1 of a second embodiment in accordance with the present invention.
Figure 4B:
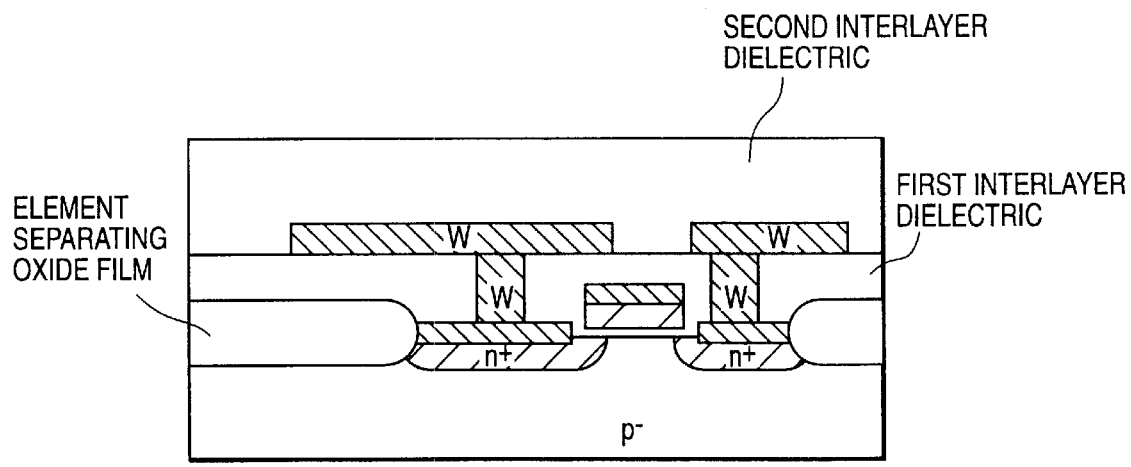
Figure 5C:
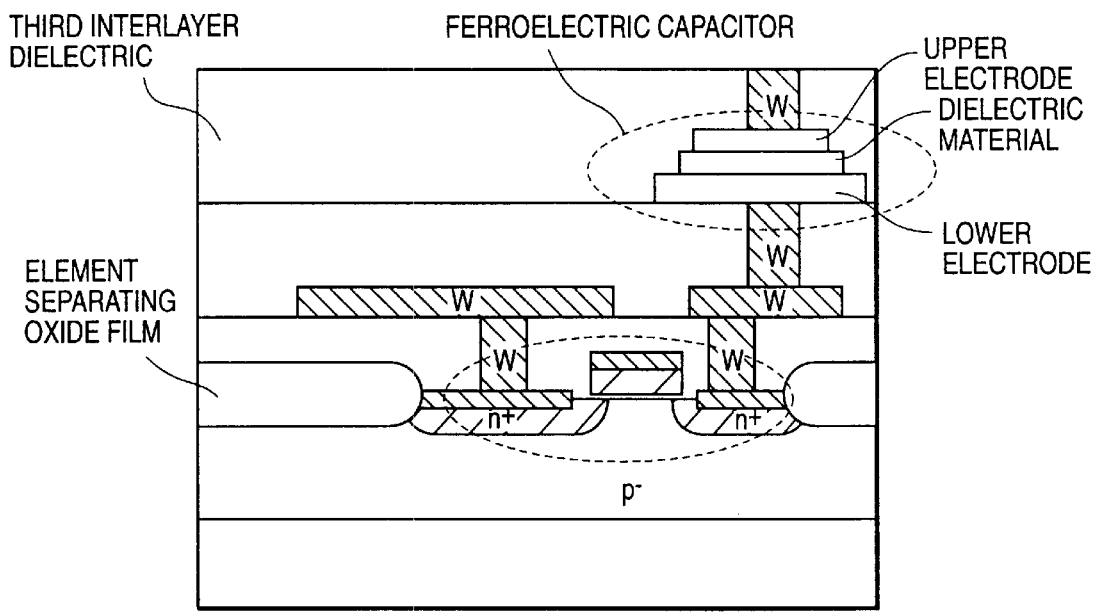
FIG. 5 is a sectional view illustrating step 2 of the second embodiment in accordance with the present invention.
Figure 5D:
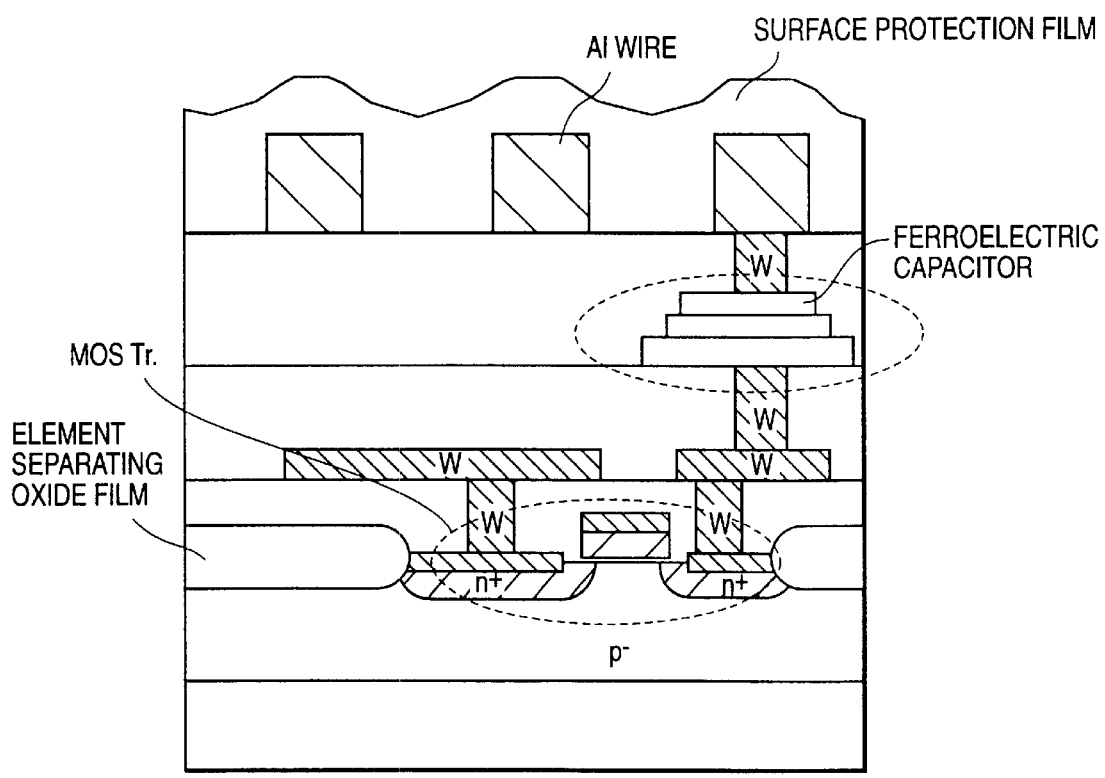

According to a publicly known method, a MOS transistor composed of source-drain regions and a gate electrode is formed, and the MOS transistor is subjected to a Ti silicide process. A sectional view of a substrate of the MOS transistor is shown in FIG. 4A. The Ti silicide process is implemented, for example, by forming Ti films on the source-drain region and the gate electrode to a thickness of about 30 nm, then subjecting them to a first heat treatment by rapid thermal process (RTP) in a nitrogen atmosphere at about 650° C. for about 30 seconds to cause Si and Ti to react, thereby producing a silicide. Thereafter, an unreacted Ti is immersed, for example, in an aqueous solution of $NH_3OH+H_2O_2$ so as to remove the unreacted Ti. Subsequently, a second heat treatment is carried out by the RTP in a nitrogen atmosphere at 800° C. for about 10 seconds thereby to reduce resistance. By this heat treatment, 50 nm-thick $TiSi_2$ films are formed on the gate electrode and the source-drain region.

Thereafter, the $TiSi_2$ films are subjected to a heat treatment in an atmosphere containing hydrogen so as to cause the $TiSi_2$ films to occlude hydrogen. The atmosphere containing hydrogen means an atmosphere that contains one or both of $H_2$ and $NH_3$. Furthermore, one or both of Ar and $N_2$ may be added to the atmosphere. Next, heat treatment is carried out in a temperature range of, for example, 500° C. to 900° C. More preferably, the heat treatment is carried out at 600° C. for 30 minutes. This heat treatment permits the $TiSi_2$ to occlude hydrogen.

The heat treatment on $TiSi_2$ in the atmosphere containing hydrogen may be carried out by replacing the nitrogen atmosphere in the second heat treatment (RTP) of the process for forming the $TiSi_2$ films described above by an atmosphere containing hydrogen. In this case, there is an advantage in that the number of steps can be reduced.

After causing $TiSi_2$ to occlude hydrogen, a first interlayer dielectric is deposited on an upper layer, then contact holes extending to the source-drain region of the MOS transistor are formed, and the contact holes are filled with a metal composed of W or the like so as to form metal plugs on the $TiSi_2$ films of the source-drain region. Then, a wiring layer composed of W or the like is formed on the first interlayer dielectric by a publicly known method for providing connection with W in the contact holes. Subsequently, a second interlayer dielectric is formed on the upper layer. See FIG. 4B.

In the following step, contact holes extending to the wiring layer composed of W or the like mentioned above are formed in the second interlayer dielectric, and the contact holes are filled with a metal composed of W or the like so as to form a metal plug on the wiring layer. Then, a capacitor constructed by a lower electrode, a ferroelectric film or a high-dielectric-constant film, and an upper electrode is formed on the metal plug, thereby providing electrical conduction between the lower electrode of the dielectric capacitor and the metal plug.

Furthermore, a third interlayer dielectric is formed on the upper layer, and a contact hole extending to the upper electrode of the dielectric capacitor is formed in the third interlayer dielectric. Then, the contact hole is filled with a metal, such as W, to form a metal plug. See FIG. 5C.

Thereafter, an Al wiring is formed using a publicly known method, and a surface protection film is deposited thereon. See FIG. 5D.

In a standard process, before completing the process, heat treatment is performed in an atmosphere containing hydrogen at a temperature of 350° C. to 450° C. to supply hydrogen to a vicinity of the gate electrode of the MOS transistor so as to bond hydrogen atoms to unpaired bonding hands of Si generated by the process. According to the present invention, $TiSi_2$ that has occluded hydrogen is disposed in the vicinity of the MOS transistor. This obviates the need for the heat treatment in the atmosphere containing hydrogen, so that the heat treatment can be performed in an inert gas, such as Ar or $N_2$.

When the heat treatment is performed in an inert gas, hydrogen is released from $TiSi_2$ that has occluded hydrogen, allowing the hydrogen to be supplied to an area around the gate electrode of the MOS transistor. Preferably, the heat treatment is performed within a temperature range of, for example, 700° C. to 900° C. before forming the Al wiring layer. More preferably, the heat treatment is performed by the rapid thermal annealing (RTA) at about 750° C. for 30 seconds or more. This heat treatment prevents a ferroelectric material, such as PZT, from being reduced; hence, a ferroelectric capacitor maintaining a good hysteresis characteristic can be formed.

In a state where the heat treatment in an atmosphere containing hydrogen has not been performed, there are many unpaired bonding hands of Si in the vicinity of the gate oxide film of the NMOS. In this state, it is difficult for a gate voltage to be applied to a semiconductor substrate, causing a threshold value of the NMOS to vary. Furthermore, unpaired bonding hands of channels lead to deteriorated mobility of electrons, resulting in a drop in an ON/OFF ratio of the NMOS.

The heat treatment in the $H_2$ gas is performed to bond $H^+$ ions to unpaired bonding hands thereby to make electrons inactive. This makes it possible to prevent the threshold value from varying and the mobility from deteriorating.

In the structure according to the present invention, the $TiSi_2$ that has occluded hydrogen is disposed in the vicinity of the gate, and unpaired bonding hands are inactivated by generating the $H^+$ ions in the neighborhood of the gate by performing the heat treatment in an atmosphere other than the one containing hydrogen. Thus, the need for carrying out the heat treatment in the atmosphere containing hydrogen after the ferroelectric film is formed is obviated, making it possible to realize a ferroelectric capacitor that maintains a good hysteresis characteristic.

As is obvious from the descriptions above, the structure according to the present invention has $TiSi_2$ disposed in the vicinity of a MOS. transistor. This arrangement makes it possible to provide the same effect as that obtained by heat treatment performed in an atmosphere containing hydrogen even when the atmosphere in which heat treatment is performed upon completion of a process does not contain hydrogen.

Thus, according to the second embodiment, in addition to the advantage provided by the first embodiment, there is another advantage in that $TiSi_2$, which has conventionally been used, can be employed as it is, obviating the need for employing a new special material as a hydrogen occluding material.

What is claimed is:

1. A semiconductor device, comprising in the order recited:

a substrate;

an MOS transistor formed on the substrate;

a first interlayer dielectric provided on at least a portion of the MOS transistor;

a hydrogen occluding material which is an interstitial hydrogen occluding material, which is provided on the first interlayer dielectric, and which is employed as a wire by being disposed in the vicinity of the top of the MOS transistor;

a second interlayer dielectric provided on the hydrogen occluding material to substantially cover the hydrogen occluding material; and a ferroelectric capacitor which has a height which is greater than that of the MOS transistor, and which is positioned apart from the hydrogen occluding material so that hydrogen released from the hydrogen occluding material is supplied to the MOS transistor but not to the ferroelectric capacitor.

2. The semiconductor device according to claim 1, wherein the interstitial hydrogen occluding material is at least one substance selected from the group consisting of (a) a metal selected from the group consisting of Ta, Ti, Zr, Fe, Cr, La, and Th, and (b) an alloy composed of two or more metals selected from the group consisting of Ta, Ti, Zr, Fe, Cr, La, and Th.

3. The semiconductor device according to claim 1, wherein the interstitial hydrogen occluding material is a silicide comprised of Si and a metal selected from the group consisting of Ta, Ti, Zr, Fe, Cr, La, and Th.

4. A method for manufacturing a semiconductor device, comprising the steps of:

forming a MOS transistor on a substrate;

forming an interlayer dielectric on at least a portion of the MOS transistor;

forming a hydrogen occluding material on the interlayer dielectric which is employed as a wire in the vicinity of the top of the MOS transistor;

performing a heat treatment in an atmosphere containing hydrogen to cause the hydrogen occluding material to occlude hydrogen; and forming a ferroelectric capacitor having a height which is greater than that of the MOS transistor after performing the heat treatment so that the hydrogen occluding material is placed between the MOS transistor and the ferroelectric capacitor.

5. The method according to claim 4, wherein the hydrogen occluding material is at least one substance selected from the group consisting of (a) a metal selected from the group consisting of Ta, Ti, Zr, Fe, Cr, La, and Th, and (b) an alloy composed of two or more metals selected from the group consisting of Ta, Ti, Zr, Fe, Cr, La, and Th.

6. A method for manufacturing a semiconductor device, comprising the steps of:

forming an MOS transistor having a source-drain region and a gate electrode on a substrate;

forming a hydrogen occluding compound on top of the source-drain region and on top of the gate electrode;

performing a heat treatment effective to cause the hydrogen occluding compound to occlude hydrogen; and forming a ferroelectric capacitor having a height which is greater than that of the MOS transistor after performing the heat treatment so that the hydrogen occluding is placed between the MOS transistor and the ferroelectric capacitor.

7. The method according to claim 6, wherein the heat treatment effective to cause the hydrogen occluding compound to occlude hydrogen is additionally effective to reduce the resistance of the hydrogen occluding compound.

8. A method for manufacturing a semiconductor device, comprising the steps of:

forming an MOS transistor having a source-drain region and a gate electrode on a substrate;

forming a hydrogen occluding compound which is an interstitial hydrogen occluding compound on top of the source-drain region and on top of the gate electrode, wherein the hydrogen occluding compound is a silicide comprised of Si and a metal selected from the group consisting of Ta, Ti, Zr, Fe, Cr, La and Th; and performing a heat treatment effective to cause the hydrogen occluding compound to occlude hydrogen.

* * * * *